(12) United States Patent
Mitteregger

(10) Patent No.: US 7,408,494 B2
(45) Date of Patent: Aug. 5, 2008

(54) CONTINUOUS-TIME DELTA-SIGMA ANALOG DIGITAL CONVERTER

(75) Inventor: Gerhard Mitteregger, Taufkirchen (DE)

(73) Assignee: National Semiconductor Germany AG, Unterhaching (DE)

( * ) Notice: Subject to any disclaimer, the term of this patent is extended or adjusted under 35 U.S.C. 154(b) by 0 days.

(21) Appl. No.: 11/640,690

(22) Filed: Dec. 18, 2006

(65) Prior Publication Data

US 2007/0171109 A1    Jul. 26, 2007

(30) Foreign Application Priority Data

Dec. 23, 2005    (DE) ................. 10 2005 061 856

(51) Int. Cl.
*H03M 3/00* (2006.01)

(52) U.S. Cl. ...................... 341/143; 341/155

(58) Field of Classification Search .......... 341/143–155
See application file for complete search history.

(56) References Cited

U.S. PATENT DOCUMENTS

| 6,927,718 | B2 * | 8/2005 | Koch ........................ 341/143 |
| 6,930,624 | B2 * | 8/2005 | Hezar et al. ................. 341/143 |
| 7,042,377 | B2 * | 5/2006 | Oliaei ........................ 341/143 |
| 2005/0093732 | A1 | 5/2005 | Clara et al. |
| 2005/0116850 | A1 | 6/2005 | Hezar et al. |

FOREIGN PATENT DOCUMENTS

| DE | 103 42 057 A1 | 5/2005 |
| WO | WO 97/26708 | 7/1997 |

OTHER PUBLICATIONS

M. Moyal et al., "A 700/900 mW/Channel CMOS Dual Analog Front-End IC for VDSL with Integrated 11.5/14.5 dBm Line Drivers"; International Solid-State Circuits Conference, 2003; Digest of Technical Papers, Paper 23.6.; ISSCC 2003, Session 23, IEEE; ISSN: 0193-6530; vol. 1, pp. 23.6-23.6.7.

* cited by examiner

*Primary Examiner*—Lam T Mai
(74) *Attorney, Agent, or Firm*—Pearne & Gordon LLP

(57) ABSTRACT

A continuous-time delta-sigma analog digital converter for converting an analog input signal to a digital output signal, comprising an analog filter with at least one integration capacitor, a cycled quantifier which quantifies the filtered analog signal for generating the digital output signal, and a feedback device with at least one digital analog converter, which supplies at least a first analog feedback signal to the analog filter corresponding to the value of the digital output signal. The feedback device for generating a second feedback signal corresponding to the differentiated output signal of the quantifier, comprises a switching device coupled capacitively to the integration capacitor, by means of which device corresponding charge portions are transmitted to the integration capacitor when there is a variation in the digital output signal.

9 Claims, 3 Drawing Sheets

CONTINUOUS-TIME DELTA-SIGMA ANALOG DIGITAL CONVERTER

BACKGROUND TO THE INVENTION

1. Scope of the Invention

This invention relates to a continuous-time delta sigma analog digital converter for converting an analog input signal to a digital output signal, comprising:

an analog filter which filters the analog input signal and has at least one integration capacitor, a quantifier operated in cycled fashion, which quantifier quantifies the filtered analog signal transmitted by the analog filter for generating the digital output signal, and a feedback device with at least one digital analog converter, which device transmits at least one analog feedback signal to the analog filter on the basis of the digital output signal.

Further, this invention relates to a method for continuous-time delta-sigma analog digital conversion for converting an analog input signal to a digital output signal, comprising:

analog filtering of the input signal using at least one integration capacitor, a cycled quantification of the filtered analog signal for generating the digital output signal, and a feedback comprising at least one digital analog conversion for supplying at least one analog feedback signal on the basis of the digital output signal for the analog filtering.

2. Description of the State of the Art

Such a converter and such a conversion method are disclosed, for example, in DE 103 42 057 A1 and WO 97/26708. In this state of the art the digital output signal of the quantifier is simultaneously transmitted to two digital analog converters and the converted (analog) signals are fed back to the analog filter at respective summation nodes.

A fundamental problem with conventional continuous-time delta-sigma analog digital converters is the interval of time, which is unavoidable in practice, between the time of quantification and the time of output and feedback of the digital output signal. The stability of the converter is adversely affected by this delay. Furthermore, the feedback devices (digital analog converter, summating amplifier, etc.) are relatively expensive and/or consume a great deal of power in the case of delta-sigma analog digital converters of prior art.

OUTLINE OF THE INVENTION

The object of this invention is to simplify feedback in a delta-sigma-analog digital converter of the type already mentioned without adversely affecting converter stability and power consumption.

In a continuous-time delta-sigma analog digital converter this object is achieved essentially in that the feedback device for generating a feedback signal corresponding to the differentiated output signal of the quantifier comprises a switching device actuated by the digital output signal of the quantifier and coupled capacitively to the integration capacitor, by means of which device corresponding charging portions are transmitted to the integration capacitor in case of a variation in the digital output signal.

In the case of the conversion method of the type already mentioned, the object is achieved essentially in that during the feedback for generating a feedback signal corresponding to the differentiated output signal of the quantifier a switching device coupled to the integration capacitor is actuated by the digital output signal of the quantifier, by means of which device corresponding charging portions are transmitted to the integration capacitor in case of a variation in the digital output signal.

According to the invention a feedback signal is generated in a manner that is simple in terms of circuit technology and enables power to be saved, which signal corresponds to the differentiated output signal of the quantifier and is fed back to the analog filter in the region of an integration capacitor. The possibility should not be excluded here that one or more further signals may be generated which are transmitted to the analog filter at other points on the basis of the generated feedback signal corresponding to the differentiated output signal of the quantifier.

Due to the new kind of feedback path or paths of the invention which are formed by the switching device with a downstream coupling capacitor device, the unavoidable delay of the quantifier can also be advantageously taken into consideration when designing the feedback device. In this case the delay is considered to be part of the system to be compensated, thus a noise transfer function with a high quantification noise suppression in the signal band, with a simultaneous adequate stability limit, is possible. Summating amplifiers, which consume a relatively large quantity of power and would introduce an additional delay into the system, necessitating a faster quantifier (with higher power consumption) or a less "aggressive" noise transfer function to maintain converter stability, may be dispensed with.

The switching element or elements of the switching device provided in the invention change their switching status exactly at the point when the value of the digital output signal changes. In the event of such a change a charging portion corresponding to the amount of the change is transmitted by the coupling capacitor device to the integration capacitor. In this case this "charging portion" may be both positive and negative, according to the sign of the variation in the digital value. On the other hand, as long as this digital value is constant, the switching device remains in its switching status (corresponding to this value). Consequently the coupling capacitor device is acted on with a constant signal and no charge is transmitted between the coupling capacitor device and the integration capacitor. Such transmission only takes place when the digital output signal varies. The switching device with the downstream coupling capacitor device therefore forms a feedback path designed as a "differentiating stage".

In one embodiment provision is made for the delta-sigma analog digital converter to be constructed so that it is fully differential.

A preferred production technology for the delta-sigma analog digital converter is CMOS technology. In particular, the converter may represent a function block of an integrated circuit device.

The analog filter preferably comprises at least one integrator and/or one resonator. When reference is made in the following to an integrator, the possibility of using a resonator instead of this integrator cannot be ruled out. An input stage of the filter is preferably formed by an integrator and/or a stage connected directly before the quantifier may be formed by an integrator. Such an integrator may, for example, comprise a so-called operational transconductance amplifier (OTA) with downstream integration capacitor. Such a device, from an operational transconductance amplifier and a capacitive load, is often also designated as a "gmC" stage. Alternatively an integrator may comprise, for example, a capacitively fed back operational amplifier.

In a preferred embodiment the integrator capacitor, which is capacitively coupled to the switching device, forms part of an integrator whose output signal is transmitted directly to the quantifier. In other words a stage connected in series immediately upstream from the quantifier is formed by an integrator which contains this integration capacitor. In this case the integrator may be formed in a manner of prior art by a transconductance element, for example, with downstream connected integration capacitor, or by a capacitively fed back operational amplifier.

In a known manner a digital signal processor (DSP) can be connected downstream of the quantifier for further processing the digital output signal. In this case the digital output signal can be branched from a circuit node arranged between the quantifier and the digital signal processor and transmitted to the feedback device.

In one embodiment the quantifier has a plurality of quantification stages. In one embodiment, for example, 16 quantification stages (equivalent to 4 bits) are provided. According to another embodiment the quantifier has, for example, 64 quantification stages (equivalent to 6 bits).

It is advantageous, both for fast quantification and for fast digital analog conversion in the feedback device, for the digital output signal of the quantifier to have thermometer coding. In this case the feedback device may, for example, have a number of feedback paths arranged parallel with each other, corresponding to the thermometer coding, which paths each lead from an output connection of the quantifier, via a series connection consisting of an actuatable switching element and a coupling capacitor, to the integration capacitor. This number of parallel feedback paths is doubled if the feedback according to the invention has a fully-differential construction. When a thermometer coding is used, identical series connections, each consisting of a switching element and a coupling capacitor, can be provided since the individual output connections of the quantifier are then equivalent. On the other hand, if another binary coding is used, the feedback device may also have a corresponding number of parallel feedback paths which are each formed by a series connection consisting of an actuatable switching element and a coupling capacitor. Different valencies of the individual output connections of the quantifier may in this case be allowed for simply by dimensioning the coupling capacitor according to the respective valency.

In a particularly simple embodiment one of two fixed preset switching potentials (e.g. supply potentials) is applied to the connection of a coupling capacitor on the switching element side leading to the integration capacitor by means of a digitally actuated switching element of the switching device, according to the switching status.

The controllable switching element or elements of the switching device may, for example, be formed by an inverter which is supplied with preset switching potentials, and which is provided at the inverter output (and therefore acts on a coupling capacitor) according to the status of a binary signal at the inverter input of one of the switching potentials.

In a preferred embodiment a setting circuit is assigned to the switching device for setting (adjusting) an output characteristic of the switching device. The setting circuit may, in particular, be designed to set an output voltage swing to a value which is essentially proportional to a voltage permanently preset by the converter design, which voltage corresponds to a voltage proportion applied by a maximum feedback signal to the integration capacitor. The setting circuit can, for example, generate at least one of two switching potentials which are transmitted from the respective switching element (according to the switching status) to a coupling capacitor. If the switching device comprises a plurality of switching elements, and these switching elements are to have an identical output characteristic, a setting circuit common to all the switching elements can advantageously be used.

BRIEF DESCRIPTION OF THE DRAWINGS

The invention is further described in the following by means of exemplary embodiments with reference to the attached drawings, in which.

DESCRIPTION OF THE PREFERRED EMBODIMENTS

Figure 1:
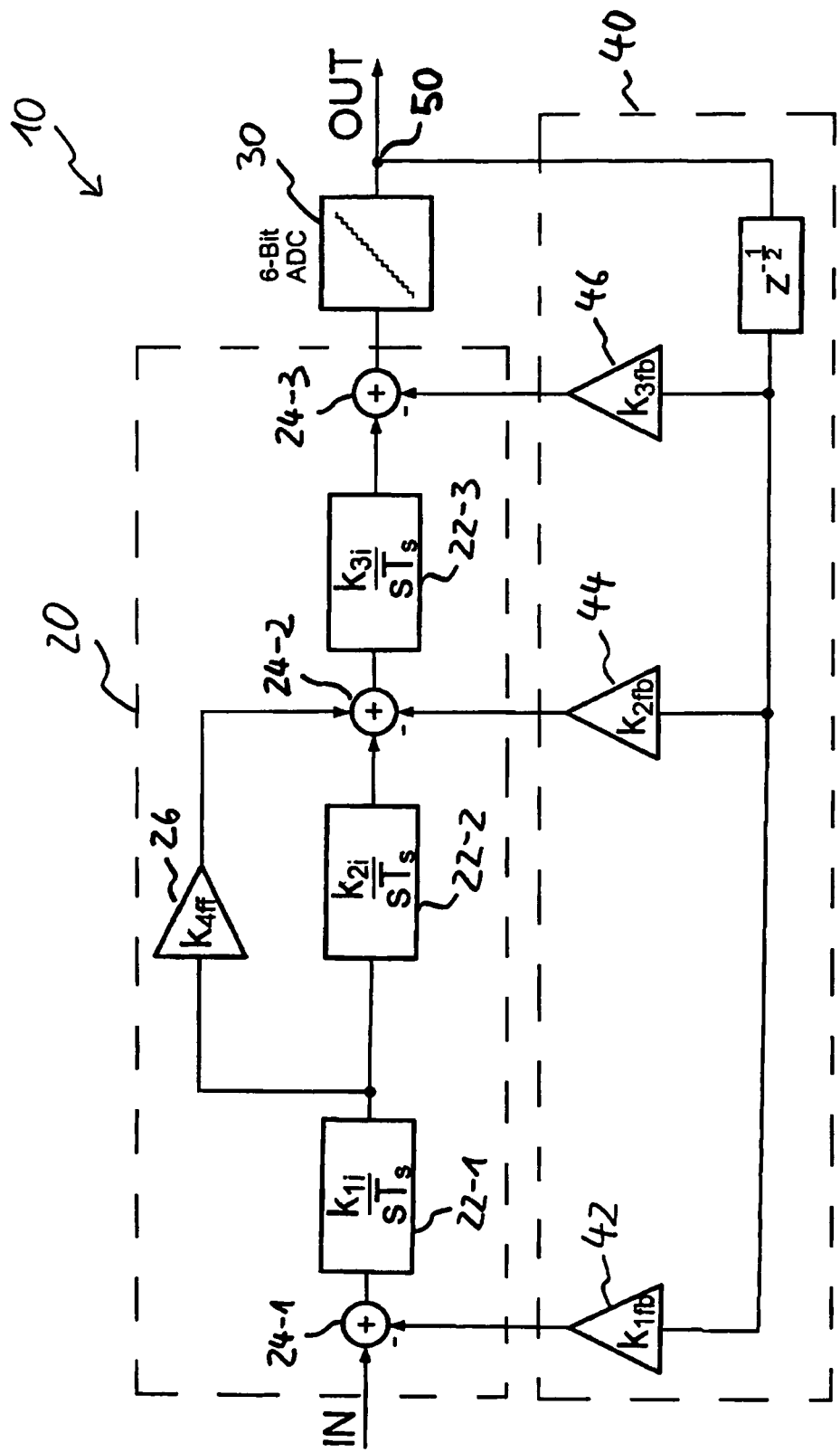
FIG. 1 shows a functional block diagram of a delta-sigma digital analog converter.

FIG. 1 illustrates diagrammatically the structure of a delta-sigma analog digital converter 10 for converting an analog input signal IN to a digital output signal OUT.

Converter 10 comprises an analog filter 20 for filtering analog input signal IN, a 6-bit quantifier (quantizer) 30 cycled by a clock signal for generating digital output signal OUT, by quantifying the signal transmitted by analog filter 20, and a feedback device 40 for feeding back analog feedback signals on the basis of digital output signal OUT.

Quite generally the integrated ("sigma") difference ("delta") between an analog input signal and an analog representation of the quantified digital output signal, in a delta-sigma analog digital converter, is transmitted to the quantifier (analog digital converter stage). In another embodiment of such a converter, also referred to as "delta modulator" in the narrower sense, the difference ("delta") between an analog input signal and the integral ("sigma") of the quantified digital output signal is transmitted to the quantifier. Due to the feedback the quantifier generates an output bit stream whose value follows the analog input signal in the time average. The continuous-time delta-sigma analog digital converter has the advantage over time-discrete delta-sigma analog digital converters of a lower power input and, at a preset power input, the advantage of a higher signal bandwidth.

Since time-discrete scanning takes place in a continuous-time delta-sigma analog digital converter in the region of the quantifier, and the values of the digital output signal are only of interest at discrete times, such converters and the signals generated on it are normally analyzed in the so-called Z-domain. The Z transformation assigns a function of the, complex variables z to a sequence of numbers (here: signal value sequence). The aim here is to transform certain mathematical operations, which are difficult to control within the range of sequences, into simpler operations for the image functions.

Correspondingly FIG. 1 symbolizes the functions of the circuit components shown by mathematical operators in the Z-domain.

Analog filter 20 comprises, in the exemplary example shown, a plurality of integrators 22-1, 22-2 and 22-3 (integrator cascade), which, together with addition points 24-1, 24-2, 24-3, a forward coupling element 26 and feedback element 28, form a filter network. The configuration of filter 20 shown is obviously only to be considered an example and may be modified within a wide range in a known manner.

A peculiarity of converter 10 consists in the fact that a feedback signal corresponding to the differentiated output signal OUT of quantifier 30 is generated by means of feedback device 40 and is fed back to a location on filter 20, namely addition point 24-3. This addition point 24-3 forms at its output the input signal for quantifier 30.

The generation of the feedback signal corresponding to the differentiated output signal OUT is described in further detail with reference to FIGS. 2 and 3.

Since the functional block diagram in FIG. 1 only reproduces the mathematical operations on the individual signals, independently of their representation (analog or digital), the digital analog conversion required in the feedback paths in the circuit implementation is not shown. A possible circuit implementation of converter 10 is explained in the following with reference to FIG. 2.

Figure 2:
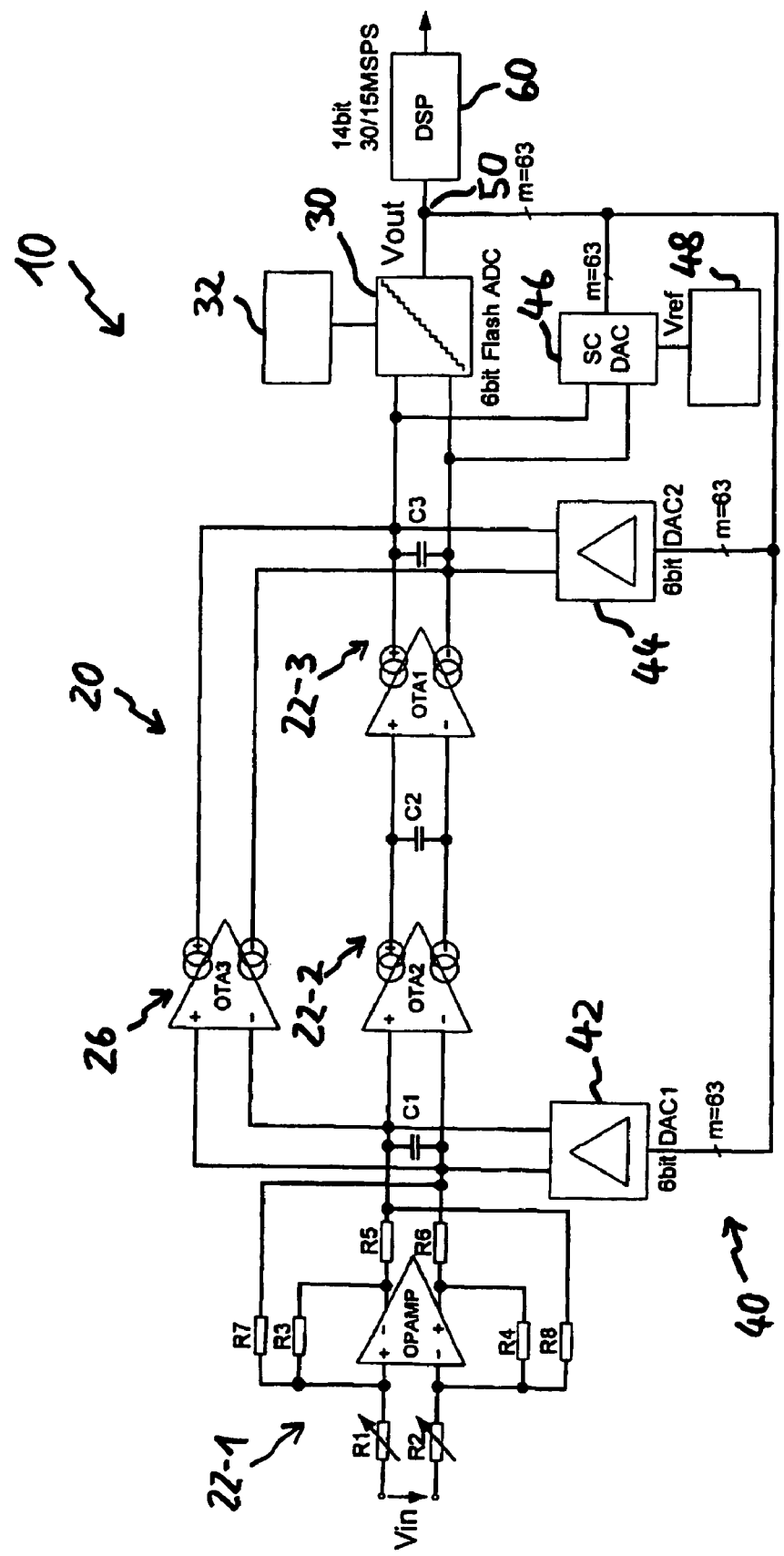
FIG. 2 shows a block diagram of the converter in FIG. 1.
Figure 3:
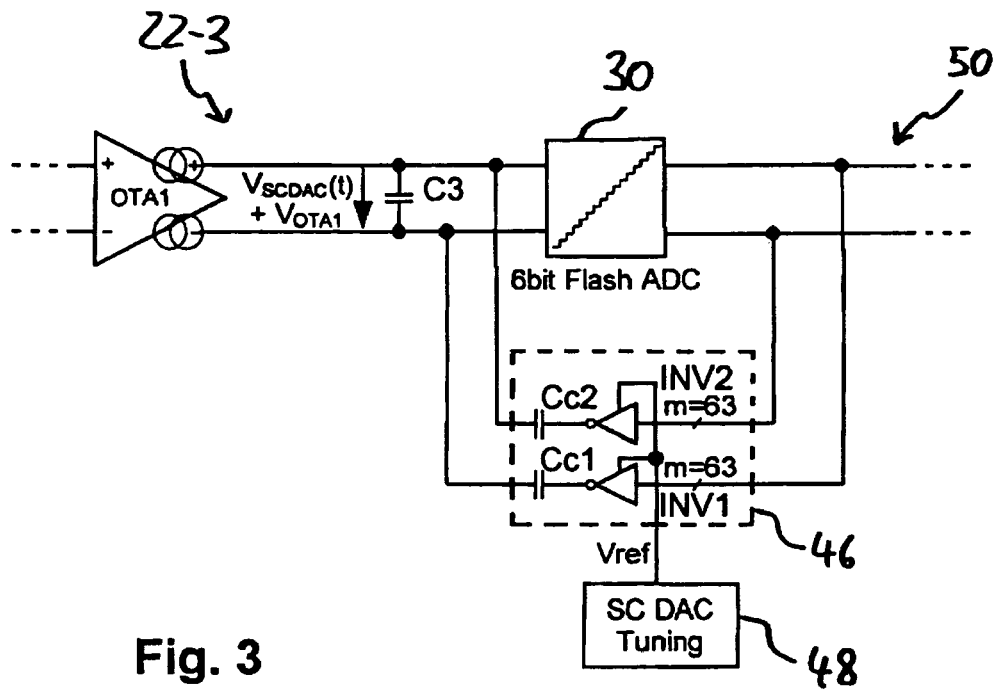
FIG. 3 shows a detail from FIG. 2 to illustrate the function of a differentiating stage of the converter.

FIG. 2 shows a detailed block diagram of delta-sigma analog digital converter 10, where the same reference numbers as in FIG. 1 are used for components with the same function In the implementation shown, integrators 22-1 of analog filter 20 is realized by a suitably externally wired operational amplifier OPAMP, whereas integrators 22-2 and 22-3 of filter 20 are each realized by a transconductance element OTA2 and OTA1 respectively, each with a downstream connected integrator capacitor C2 and C3 respectively. Analog input signal IN is represented by an input voltage $V_{IN}$ and digital output signal OUT is represented by an output voltage signal $V_{OUT}$.

Quantifier 30 has 64 quantification stages and represents output signal OUT in a thermometer coding on 63 output lines which, for the sake of the simplicity of the representation in FIG. 2, are symbolized only by a single line connection. Quantifier 30 is constructed for this purpose, i a known manner, as a parallel connection of 63 comparators with 63 comparator thresholds arranged in a "ladder". A common clock signal is transmitted to the comparators simultaneously, via which signal the respective comparisons of the filtered input signal with the comparator thresholds are carried out at time-discrete periodic times so that a 6-bit output signal OUT, supplied cycled, is present at the output of quantifier 30. The physical representation is provided according to the thermometer coding in 63 digital voltages (symbolized by $V_{OUT}$).

A calibration circuit 32 is provided for accurate setting of the comparator thresholds in the operation of converter 10. A digital signal processor (DSP) 60, for further digital processing of the bit stream output by quantifier 30, is also seen in FIG. 2.

Feedback device 40 of converter 10 is formed essentially by circuit components 42, 44 and 46 described in the following. These components are represented only by simple drawing in FIG. 2 for the sake of simplicity of the representation. These components are actually provided 63-fold, parallel with each other, according to the processing of the signal transmitted via 63 lines corresponding to a thermometer coding.

A circuit node 50 (63-fold or, in the fully-differential design, 126-fold) is provided at the output of quantifier 30, from which node output signal $V_{OUT}$ is branched to feedback device 40. A first, conventional feedback path is formed by a first digital analog converter 52 from branching node 50, the output signal of which is transmitted to integrator 22-1 as a fully-differential current signal. A second feedback path, also conventional, is formed by a second digital analog converter 44 whose output signal is transmitted as a fully-differential current signal to integrator 22-3.

The new type of feedback path provided according to the invention is, in contrast, formed by a differentiating stage 46 which is connected on the input side to node 50 and on the output side to integration capacitor C3, which is assigned to integrator 22-3 connected in series immediately upstream from quantifier 30.

The object of differentiating stage 46 consists in generating a feedback signal corresponding to the differentiated output signal of quantifier 30, and in feeding it back to filter 20 in the region of integration capacitor C3. The function of this stage 46 and of an assigned setting circuit 48 is explained in the following with reference to FIGS. 3 and 4.

FIG. 3 once again shows components 22-3, C3, 30, 46 and 48 in FIG. 2, with a detailed representation of the structure of differentiating stage 46.

In the fully-differentiated embodiment represented, differentiating stage 46 comprises two inverters INV1, INV2, whose inputs are connected to node 50, and whose outputs are each connected to a first connection of a coupling capacitor Cc1 and Cc2 respectively. The second connections of these coupling capacitors Cc1, Cc2 are each connected to a connection of integration capacitor C3. Each inverter generates at its output an inverted version of the binary input signal deriving from quantifier 30. Here the output signal of each inverter corresponds either to a preset supply potential of the entire device, or to a potential denoted by Vref and preset by setting circuit 48, according to the input signal status of the inverter. As already mentioned above, the parallel arrangement of two series connections shown in FIG. 3, which circuits are each formed from an inverter (switching element) and a coupling capacitor, is actually present in a 63-fold design.

As long as the digital value output by quantifier 30 is constant the output signals of all the inverters retain their status, so that no feedback signal influences the operation of integrator 22-3 because of the capacitive coupling to integration capacitor C3. However, as soon as the digital output value of the quantifier 30 changes, more or fewer inverter output signals will also change, so that corresponding (sign-dependent) charging portions are transmitted to integration capacitor C3 because of the capacitive coupling. Since a thermometer coding of the quantifying output signal is used in the exemplary embodiment represented, it must be ensured that the charge transmitted when there is a variation in the digital value is proportional to the number of inverters, which change their switching status due to this variation (The 63 line pairs have the same "valency"). In the example represented this is achieved quite simply by first supplying all the inverters of the commonly used setting circuit 48 with the default potential Vref, and secondly by identical dimensioning coupling capacitors Cc1, Cc2 for all (63) line pairs.

Since one of the two possible output potentials of inverters INV1, INV2 is formed by a permanently preset supply potential ("ground"), and the other default potential Vref is generated by common setting circuit 48, this setting circuit 48 consequently defines the output voltage swing of each individual inverter. In the case of permanently preset coupling capacitors Cc1, Cc2 in turn defines the extent of the charge transfer to integrator 22-3 that takes place when switching over an inverter.

However, it has been found to be problematical if this output voltage swing of the switching elements (inverters) used is permanently preset, e.g. is formed simply by supply potentials for the entire device or is simply derived from such potentials.

It is better if the voltage swing of the switching elements is adapted dynamically during operation in order to compensate for any variations due to the operation (e.g. due to temperature and/or production conditions). In the embodiment shown this is achieved by dynamic setting of the potential Vref provided by setting circuit 48. This setting is carried out according to the relation:

$$V_{SCDACmax}/Vref = Cc/(2C+Cc),$$

where $V_{SCDACmax}$ denote a voltage preset by the design of converter 10, Cc denotes the capacitance of the (identically dimensioned) capacitors Cc1 and Cc2, and C denotes the capacitance of the integration capacitor C3.

$V_{SCDACmax}$ serves as the default for setting circuit 48. The voltage prevailing in operation on integration capacitor C3 is composed of a voltage portion $V_{OTA1}$ acted on by OTA1 and a voltage portion $V_{SCDAC}(t)$ acted on by differentiating stage 46.

$V_{SCDAC}(t)$ varies if there is a variation in the digital output value of quantifier 30. $V_{SCDAC}(t)$ at a certain time of $t=T\times(n+1)$ is composed of $V_{SCDAC}$ (T×n), plus the variation in the quantifier output value multiplied by $V_{SCDACmax}$. Here T denotes a scanning interval of quantifier 30 and n a natural number.

Figure 4:
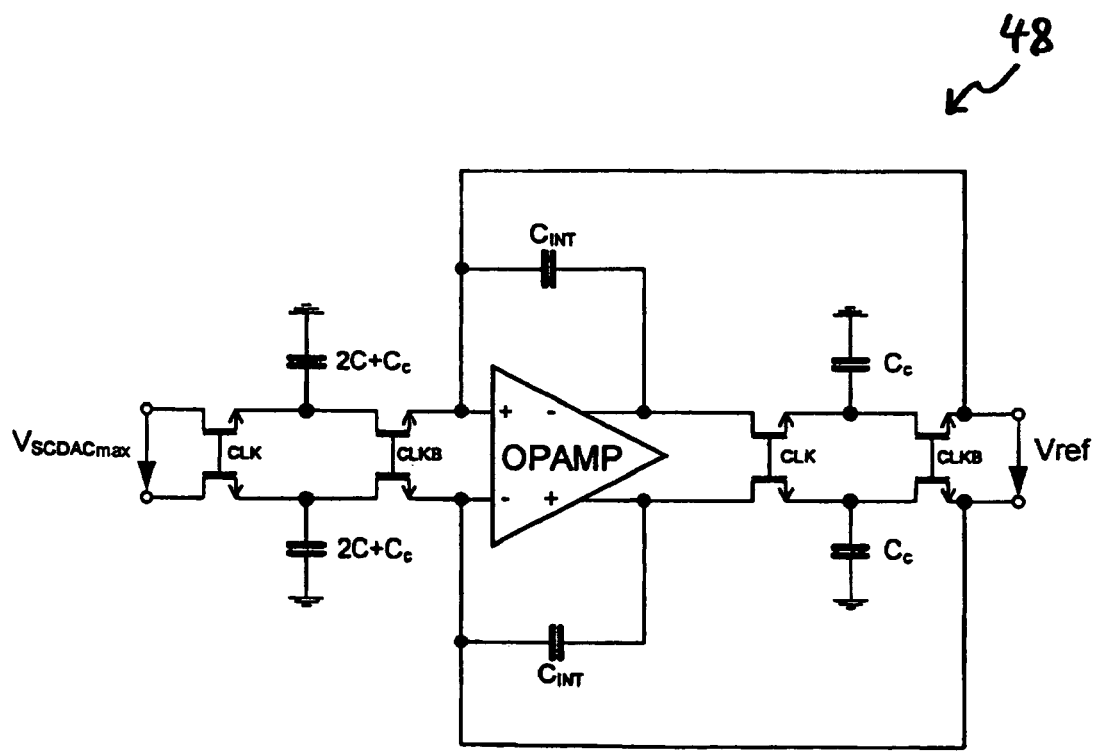
FIG. 4 shows a circuit diagram of a setting circuit used for setting the differentiating stage.

FIG. 4 illustrates, as an example, a circuit realization of this setting of Vref by means of charge transfer circuit 48 operated in a cycled fashion.

Setting circuit 48 is supplied at one input with the voltage $V_{SCDACmax}$. The desired potential Vref, set according to the above relation, is provided at the output. For this purpose setting circuit has a series connection of charge transfer capacitors arranged in pairs (fully-differential) with capacitance values of 2C+Cc, $C_{INT}$ and Cc, where the capacitance $C_{INT}$ may be selected largely arbitrarily, and is arranged as shown in a feedback path of an operational amplifier OPAMP, and where load transfer transistor pairs each actuated by a clock signal CLK (or an inverted version CLKB of it) are arranged on the input side and output side and between each of the individual charge transfer capacitors. As is easily comprehensible from the configuration shown in FIG. 4, circuit 48 sets the output voltage Vref according to the desired relation.

The invention claimed is:

1. A continuous-time delta-sigma analog digital converter for converting an analog input signal (IN) to a digital output signal (OUT), comprising:

an analog filter (20) which filters the analog input signal (IN) and has at least one integration capacitor, a quantifier (30) operated in cycled fashion, which quantifier quantifies the filtered analog signal transmitted by the analog filter for generating the digital output signal (OUT), and a feedback device (40) with at least one digital analog converter, which device transmits at least a first analog feedback signal to analog filter (20) corresponding to the value of the digital output signal (OUT), wherein the feedback device (40) comprises a switching device (INV1, INV2) actuated by the digital output signal (OUT) of the quantifier (30) and coupled capacitively (Cc1, Cc2) to the integration capacitor for generating a second feedback signal corresponding to the differentiated output signal of the quantifier (30), by means of which device charge portions are transmitted to the integration capacitor if there is a variation in the digital output signal (OUT), wherein the charge portions correspond to the amount of the variation.

2. The converter according to claim 1, wherein the integration capacitor, which is coupled capacitively to the switching device (INV1, INV2), is part of an integrator (22-3) whose output signal is transmitted directly to the quantifier (30).

3. The converter according to claim 2, wherein the integrator (22-3) is formed by a transconductance element with an integration capacitor connected in series downstream.

4. The converter according to claim 1, wherein the quantifier (30) has a plurality of quantification stages.

5. The converter according to claim 1, wherein the digital output signal (OUT) of the quantifier (30) has a thermometer coding.

6. The converter according to claim 5, wherein the feedback device (40) has a number of feedback paths arranged in parallel with each other corresponding to the thermometer coding, which paths each lead from an output connection of the quantifier (30) via a series connection, comprising an actuatable switching element (INV1, INV2) and a coupling capacitor (Cc1, Cc2), to the integration capacitor.

7. The converter according to claim 1, further compromising a setting circuit (48) which is assigned to the switching device (INV1, INV2), for setting an output characteristic of the switching device (INV1, INV2).

8. The converter according to claim 7, wherein the setting circuit sets an output voltage swing (Vref) of at least one controllable switching element of the switching device (INV1, INV2).

9. The converter according to claim 8, wherein the setting circuit (48) sets the output voltage swing (Vref) of the controllable switching element (INV1, INV2) to a value which is proportional to a voltage ($V_{SCDACmax}$) permanently preset by the converter design, which voltage corresponds to a voltage portion ($V_{SCDAC}(t)$) acted on by a maximum feedback signal on the integration capacitor.

* * * * *